United States Patent [19]
Sakakibara et al.

[11] Patent Number: 5,824,437
[45] Date of Patent: Oct. 20, 1998

[54] MASK AND METHOD OF CREATING MASK AS WELL AS ELECTRON-BEAM EXPOSURE METHOD AND ELECTRON-BEAM EXPOSURE DEVICE

[75] Inventors: Takayuki Sakakibara; Satoru Sagoh, both of Kasugai; Satoru Yamazaki, Kawasaki; Kiichi Sakamoto, Kawasaki; Hiroshi Yasuda, Kawasaki, all of Japan

[73] Assignee: Fujitsu Limited, Kawasaki, Japan

[21] Appl. No.: 685,958

[22] Filed: Jul. 22, 1996

[30] Foreign Application Priority Data

Jan. 9, 1996 [JP] Japan ................................ 8-001608
Mar. 19, 1996 [JP] Japan ................................ 8-063535

[51] Int. Cl.$^6$ ....................................................... G03F 9/00
[52] U.S. Cl. ................................................. 430/5; 430/296
[58] Field of Search .................. 430/5, 296; 250/492.22, 250/492.3

[56] References Cited

U.S. PATENT DOCUMENTS 5,288,567  2/1994  Sakamoto et al. ............................ 430/5
5,557,110  9/1996  Itoh .............................................. 430/5

OTHER PUBLICATIONS

Yamashita et al., "Resolution analysis in electron–beam cell projection lithography system," *J. Vac. Sci. Technol. B.* vol. 13, No. 6, Nov./Dec. 1995, pp. 2473–2477.

*Primary Examiner*—S. Rosasco
*Attorney, Agent, or Firm*—Staas & Halsey

[57] ABSTRACT

A mask for exposure of an object by an electron beam is formed of a plate of material which blocks the electron beam and which has plural pattern exposure blocks defined therein, each having one or more aperture defining regions therein and, when selected, determining the shaping of the electron beam passing therethrough so as to expose a respective pattern on an object. Each aperture-defining region has one aperture or plural, spaced apertures formed respectively therein, having a total area size, selected to be smaller than the area size of the aperture defining region in accordance with controlling the current level of an electron beam passing therethrough, while reducing Coulomb interaction of the electron beam passing through the aperture or apertures of each aperture defining portion of the pattern exposure block.

30 Claims, 16 Drawing Sheets

FIG. 14

|  | MSKG BEAM WIDTH (μm) | | | |
| --- | --- | --- | --- | --- |
|  | 0.02 | 0.03 | 0.04 | 0.05 |
| NUMBER OF MSKG BEAMS   1 | 1.015 | 1.018 | 1.020 | 1.025 |
| 2 | 1.017 | 1.021 | · | · |
| 3 | 1.020 | · | · | · |
| 4 | 1.024 | · | · | · |
| 5 | 1.030 | · | · | · |

MASK AND METHOD OF CREATING MASK AS WELL AS ELECTRON-BEAM EXPOSURE METHOD AND ELECTRON-BEAM EXPOSURE DEVICE

BACKGROUND OF THE INVENTION

1. Field of the Invention

The present invention generally relates to electron-beam-exposure methods and electron-beam-exposure devices, and particularly relates to an electron-beam exposure method and an electron-beam exposure device which carry out a block exposure by using a block mask.

2. Description of the Related Art

In recent years, electron-beam-exposure methods and electron-beam-exposure devices have been used in the field in order to increase circuit density of integrated circuits. In the electron-beam-exposure scheme, the size of an electron beam can be made as small as several angstroms, so that fine patterns smaller than 1 $\mu$m can be created.

If a pattern is to be drawn by an electron beam with a single stroke, an exposure process will take an undesirably long time. To counter this, a block-exposure method has been proposed, in which a plurality of blocks, each having at least one aperture of various pattern shapes, are provided on an aperture mask, and an electron beam is directed to a selected one of these blocks. Here, the aperture mask is made from a plate capable of blocking an electron beam, so that an electron beam passing through an aperture of the mask has a cross-sectional shape corresponding to a shape of the aperture. The electron beam passing through the apertures of the selected block is then directed to an object such as a wafer to form a pattern of the apertures. This block-exposure method can achieve as high a throughput as 1 $cm^2$/sec, and is known to have superior characteristics in terms of fineness of the processing, the positioning accuracy, the turn-around speed, and reliability.

FIG. 1 is a block diagram of an example of an electron-beam-exposure device of the block-exposure type of the prior art.

In FIG. 1, an electron-beam exposure device 100 includes an exposure-column unit 110 and a control unit 150. The exposure-column unit 110 includes an electron-beam generator 114 having a cathode 111, a grid 112, and an anode 113. The exposure-column unit 110 further includes a first slit 115 for rectangular shaping of the electron beam, a first lens 116 converging the shaped beam, and a slit deflector 117 deflecting a position of the shaped beam on a mask 120 based on a deflection signal S1. The exposure-column unit 110 further includes second and third lenses 118 and 119 opposing each other, the mask 120 mounted movably in a horizontal direction between the second and third lenses 118 and 119, and first-to-fourth deflectors 121 through 124 deflecting the beam between the second and third lenses 118 and 119 based on position information P1 through P4 to select one of a plurality of holes (apertures) provided through the mask 120. The exposure-column unit 110 further includes a blanking aperture electrode 125 cutting off or passing the beam according to a blanking signal, a fourth lens 126 converging the beam, an aperture 127, a refocus coil 128, and a fifth lens 129. The exposure-column unit 110 further includes a dynamic focus coil 130, a dynamic stigmator coil 131, an objective lens 132 projecting the beam on to a wafer, and a main deflector 133 and a sub deflector 134 positioning the beam on the wafer according to exposure-position signals S2 and S3. The exposure-column unit 110 further includes a stage 135 carrying the wafer to move it in X–Y directions, and first-to-fourth alignment coils.

The control unit 150 includes a memory media 151 comprising a disk or MT recorder for storing design data of integrated circuits, and a CPU 152 controlling the electron-beam exposure device. The control unit 150 further includes a data-management unit 153, an exposure-management unit 159, a mask-stage controlling unit 160, a main-deflector-deflection setting unit 161, and a stage controlling unit 162, all of which are connected via a data bus (i.e., VME bus). Exposure data includes main-deflector data and sub-deflector data, and is stored in a buffer memory 154 via the data-management unit 153 prior to the exposure process. The buffer memory 154 is used as a high-speed buffer for reading the exposure data, thereby negating influence of low-speed data reading from the memory media 151.

The main-deflector data is set in the main-deflector-deflection setting unit 161 via the exposure-management unit 159. The exposure-position signal S2 is output after the deflection amount is calculated, and is provided to the main deflector 133 via the DAC/AMP 170. Then, the sub-deflection data for exposing a selected field is read from the data-management unit 153, and is sent to the sub-deflector-deflection setting unit 155. In the sub-deflector-deflection setting unit 155, the sub-deflection data is broken down into shot data by the pattern generating unit 156, and is corrected by the pattern-correction unit 157. These circuits operate in a pipeline according to a clock signal generated by the clock setting unit 158.

After the processing of the pattern-correction unit 157, a signal S1 for setting a slit size, mask-deflection signals P1 through P4 for determining a deflected position on the mask 120 of the beam deflected according to the signal S1 after passing through the first slit 115, a signal S3 for determining a position on the wafer of the beam shaped by the mask 120, and a signal S4 for correcting distortion and blurring of the beam are obtained. The signal S1, the mask-deflection signals P1 through P4, the signal S3, and the signal S4 are supplied to the exposure-column unit 110 via the DAC (digital-to-analog converter)/AMP(amplifier) 166, DAC/AMP 167, DAC/AMP 171, and DAC/AMP 169. Also, the clock setting unit 158 provides a blanking controlling unit 165 with a B signal. A BLK signal for controlling the blanking operation from the blanking controlling unit 165 is supplied to the blanking aperture electrode 125 via the AMP 168.

An exposure position on the wafer is controlled by the stage controlling unit 162. In doing so, a coordinate position detected by a laser interferometer 163 is supplied to the stage controlling unit 162. Referencing to the coordinate position, the stage controlling unit 162 moves the stage 135 by driving a motor 164.

In this manner, the control unit 150 controls the exposure-column unit 110 so that the electron beam emitted from the electron-beam generator 114 is shaped rectangularly by the first slit 115, converged by the lenses 116 and 118, deflected by the mask deflectors 121 and 122, and directed to the mask 120. The electron beam having passed through the mask 120 passes through the blanking aperture electrode 125, is converged by the fourth lens 126, is deflected to a center of a sub field of about 100-$\mu$m square by the main deflector 133, and is deflected within this sub field by the sub deflector 134.

In general, electron-beam-exposure methods have a problem of Coulomb interaction. This is a phenomenon in which electrons of the electron beam are repelled by each other so that a cross section of the electron beam is blurred in general proportion to the current amount of the beam. Especially, at the focus point of the electron beam, a probability of electrons interacting with each other is increased to bring about undesirable blurring of the image.

In the block-exposure method using an electron beam passing through the apertures to form a fine pattern over a wide area, the current amount of the electron beam tends to be large, making the block-exposure method susceptible to the Coulomb interaction. Use of a shorter-focusing-distance lens can lessen the effect of the Coulomb interaction, but not to a sufficient extent.

In order to reduce the current amount of the electron beam in the block-exposure method, two methods can be used. These two methods are 1) reducing the current density of the electron beam and 2) reducing the size of an exposed area (size of apertures). Since the current amount is provided as a product of the current density and the exposure-area size, a reduction in one of these two factors can lower the current amount.

When the current density is lowered as in method 1), exposure time must be increased in order to sustain a required exposure amount of the wafer. Thus, throughput, i.e., production is sacrificed. To keep a throughput reduction as small as possible, it is desirable to change the current density according to an area size of the apertures. Namely, an exposure with a low current density is carried out in a long time when the area size of the apertures is large, and an exposure with a high current density is carried out by taking a short period of time when the area size of the apertures is small. In this case, however, the current density is changed during the exposure process, leading to an instability in the operation of the device. Because of this reason, this method is not practical.

In order to reduce the area size of the apertures in the method 2), a block size (area size selected for one shot of an electron beam) may be made smaller when a pattern density is high, and may be made larger when the pattern density is small. By doing so, it is possible to avoid a sacrifice of the throughput. In this case, however, it is likely that some portions in a block size may not be used effectively. Also, there is a downside in that the block extraction process and the block-exposure process become complicated.

Accordingly, an exposure method using a low current density while sacrificing the throughput is used in the prior-art block-exposure process.

There is also another problem in the block-exposure method, and this problem will be described below.

As described above, in the electron-beam-exposure device using the block-exposure method, a plurality of blocks each having at least one aperture of various pattern shapes are provided on an aperture mask, and an electron beam is directed to a selected one of these blocks. The electron beam passing through the apertures of the selected block is then directed to a wafer to form a pattern of the apertures on the wafer.

Each block has apertures of a different pattern shape, and the current amount of the electron beam passing through the apertures of a given block is dependent on the area size of the apertures. Thus, when different blocks are selected, different amounts of current are directed via the electron beam to the wafer.

FIGS. 2A and 2B are illustrative drawings showing examples of blocks having different aperture area sizes.

Compared to a pattern of apertures shown in FIG. 2A, a pattern of apertures of FIG. 2B has a smaller area size. When these two patterns are exposed at the same exposure amount, an appropriate exposure amount for the pattern of FIG. 2A will result in an under-exposure for the pattern of FIG. 2B, and an appropriate exposure amount for the pattern of FIG. 2B will result in an over-exposure for the pattern of FIG. 2A. Namely, use of the same exposure amount can not properly draw both patterns of FIG. 2A and FIG. 2B. Thus, an exposure amount is generally increased for a pattern having a smaller aperture area size as shown in FIG. 2B, compared to when a pattern having a larger aperture area size as shown in FIG. 2A is exposed. In order to increase the exposure amount, either the exposure time can be increased or the current density of the electron beam can be increased, as previously described.

As described above, different exposure amounts may be set for different patterns having different aperture area sizes. However, there is a problem in this method concerning an adjustment of the exposure amount.

FIG. 3 is an illustrative drawing showing a block and an aperture pattern within the block for explaining the problem concerning the exposure amount adjustment.

In FIG. 3, a block 200 includes an aperture 201 and an aperture 202. Denoting an area size of the aperture 201 as A1 and an area size of the aperture 202 as A2, A1 is much smaller than A2. In the exposure-amount-adjustment method, an exposure amount for a block is determined according to a total area size of apertures of that block. Therefore, the exposure amount for the block 200 is determined based on a total area size A1+A2. When an exposure amount is determined in this manner, an exposure of the aperture 202 is properly conducted. However, the aperture 201 is under-exposed, so that an appropriate pattern is not created. Namely, an aperture having a smaller area size tends to be under-exposed when a plurality of apertures having vastly different area sizes are included in a block. This is because the exposure amount is adjusted block by block.

In addition, there is the influence of the Coulomb interaction described above. In order to suppress the Coulomb interaction, the current density of the electron beam needs to be reduced while an exposure time is increased to keep an appropriate exposure amount, as previously described. However, it is not desirable to reduce the current density indiscriminately for all the blocks including blocks free from the Coulomb interaction, because it results in a lower throughput. Also, setting a different current density for each different block leads to inordinate changes in the current density, thereby making the operation of the device unstable.

Accordingly, there is a need for a block-exposure method and a block-exposure device which can reduce an influence of the Coulomb interaction without lowering the throughput, without making the device operation unstable, and without complicating the processes, and, also, there is a need for a mask and a method of creating the mask used in such a block-exposure method and such a block-exposure device.

Also, there is a need for a block-exposure method and a block-exposure device which can reduce an influence of the Coulomb interaction and can create a fine pattern of a small-size aperture with an appropriate exposure amount.

SUMMARY OF THE INVENTION

It is a general object of the present invention to provide a block-exposure method and a block-exposure device which can satisfy the needs described above.

It is another and more specific object of the present invention to provide a block-exposure method and a block-exposure device which can reduce influence of the Coulomb interaction without lowering the throughput (production rate), without making the operation of the device unstable, without complicating the processes, and, also, to provide a mask and a method of creating the mask used in such a block-exposure method and such a block-exposure device.

In order to achieve the above objects according to the present invention, a block-exposure method and a block-exposure device use a mask having a plurality of blocks each having at least one aperture, where an electron beam passing through the at least one aperture of a selected one of the blocks is directed to an object such as a wafer to form a pattern on the object. The mask includes a plate capable of blocking the electron beam, and micro rectangular regions forming the pattern on the plate, each of the micro rectangular regions containing one of micro apertures formed through the plate, the one of the micro apertures having an area size smaller than that of a corresponding one of the micro rectangular regions, wherein a total area size of the micro apertures is smaller than a predetermined size.

Use of the mask having the micro apertures makes it possible to limit a current amount of the electron beam passing through the micro apertures when forming on the wafer the pattern corresponding to an arrangement of the micro rectangular regions including the micro apertures. Since an exposure time can be prolonged for each block by a proper time period to ensure an appropriate exposure amount, an exposure process substantially free from influence of the Coulomb interaction is achieved. In this exposure process, a reduction in the current amount is achieved appropriately for each block without requiring a change in the current density, so that reduction in the throughput is minimized, and, also, operation of the device is not unstable.

It is still another object of the present invention to provide a block-exposure device which can reduce influence of the Coulomb interaction and can create a fine pattern of a small-size aperture with an appropriate exposure amount.

In order to achieve the above object according to the present invention, a method of exposing a wafer to an electron beam using a mask having a plurality of blocks each having at least one aperture is provided, where an electron beam passing through at least one aperture of a selected one of the blocks is directed to the wafer to form a pattern on the wafer. The method includes the steps of determining an exposure amount for one of the blocks by using as a reference a first aperture most likely to be under-exposed among the at least one aperture of the one of the blocks, inserting first structural-type masking beams ("MSKG BM") into other apertures of the at least one apertures when the exposure amount makes the other apertures over-exposed, so that the electron beam passing through the other apertures with the first masking beams, has an appropriate current amount, and exposing the wafer with the exposure amount to form the pattern thereon. The method further includes the steps of inserting second masking beams into the first aperture and the other apertures with the first masking beams to reduce a current amount of the electron beam when the current amount of the electron beam passing through the first aperture and the other apertures with the first masking beams is greater than a predetermined amount, and determining an exposure time such that the current amount of the electron beam gives an appropriate exposure amount for the pattern.

The same object can be achieved by a device for exposing a wafer to an electron beam using a mask having a plurality of blocks each having at least one aperture, where an electron beam passing through the at least one aperture of a selected one of the blocks is directed to the wafer to form a pattern on the wafer. The device includes a unit for determining an exposure amount for one of the blocks by using as a reference a first aperture most likely to be under-exposed among the at least one aperture of the one of the blocks, a unit for inserting first masking beams into other apertures of the at least one apertures when the exposure amount makes the other apertures over-exposed, so that the electron beam passing through the other apertures with the first masking beams has an appropriate current amount, and a unit for exposing the wafer with the exposure amount to form the pattern thereon. The device further includes a unit for inserting second masking beams into the first aperture and the other apertures with the first beams to reduce a current amount of the electron beam when the current amount of the electron beam passing through the first aperture and the other apertures with the first beams is greater than a predetermined amount, and a unit for determining an exposure time such that the current amount of the electron beam gives an appropriate exposure amount for the pattern.

In the method and the device described above, an exposure amount is set in accordance with the aperture most likely to be under-exposed, so that even the finest pattern is appropriately created without suffering from an under-exposure. Also, the other apertures to be over-exposed at this exposure amount are inserted with the masking beams, so that even the larger patterns are properly created without suffering from an over-exposure. Further, when the influence of the Coulomb interaction is undesirably large, masking beams can be further inserted into all apertures without losing a balance between the apertures to reduce the influence of the Coulomb interaction. Thus, appropriate patterns are created.

Other objects and further features of the present invention will be apparent from the following detailed description when read in conjunction with the accompanying drawings.

BRIEF DESCRIPTION OF THE DRAWINGS

FIG. 14 is a table chart showing a data table for explaining an alternate example of the first embodiment of the second principle.

DETAILED DESCRIPTION OF THE PREFERRED EMBODIMENTS

In the following, principles and embodiments of the present invention will be described with reference to the accompanying drawings.

Figure 4A:
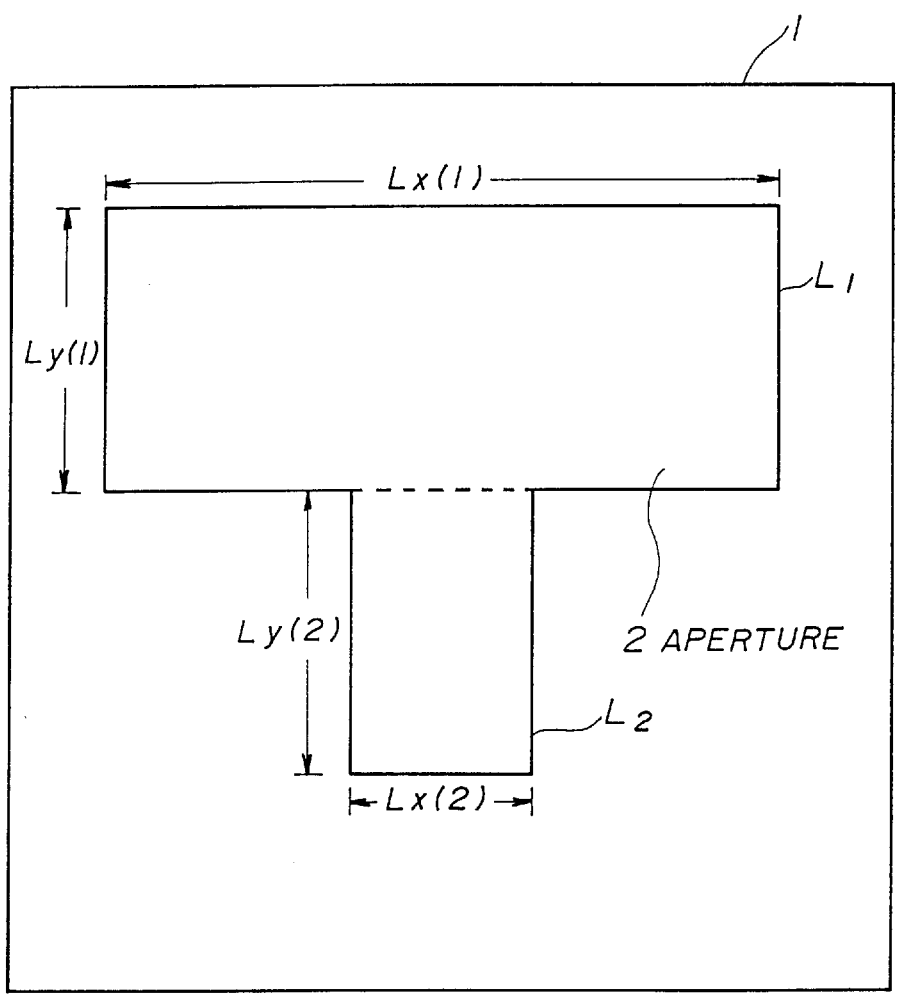
FIGS. 4A and 4B are illustrative drawings for explaining a first principle of the present invention.
Figure 4B:
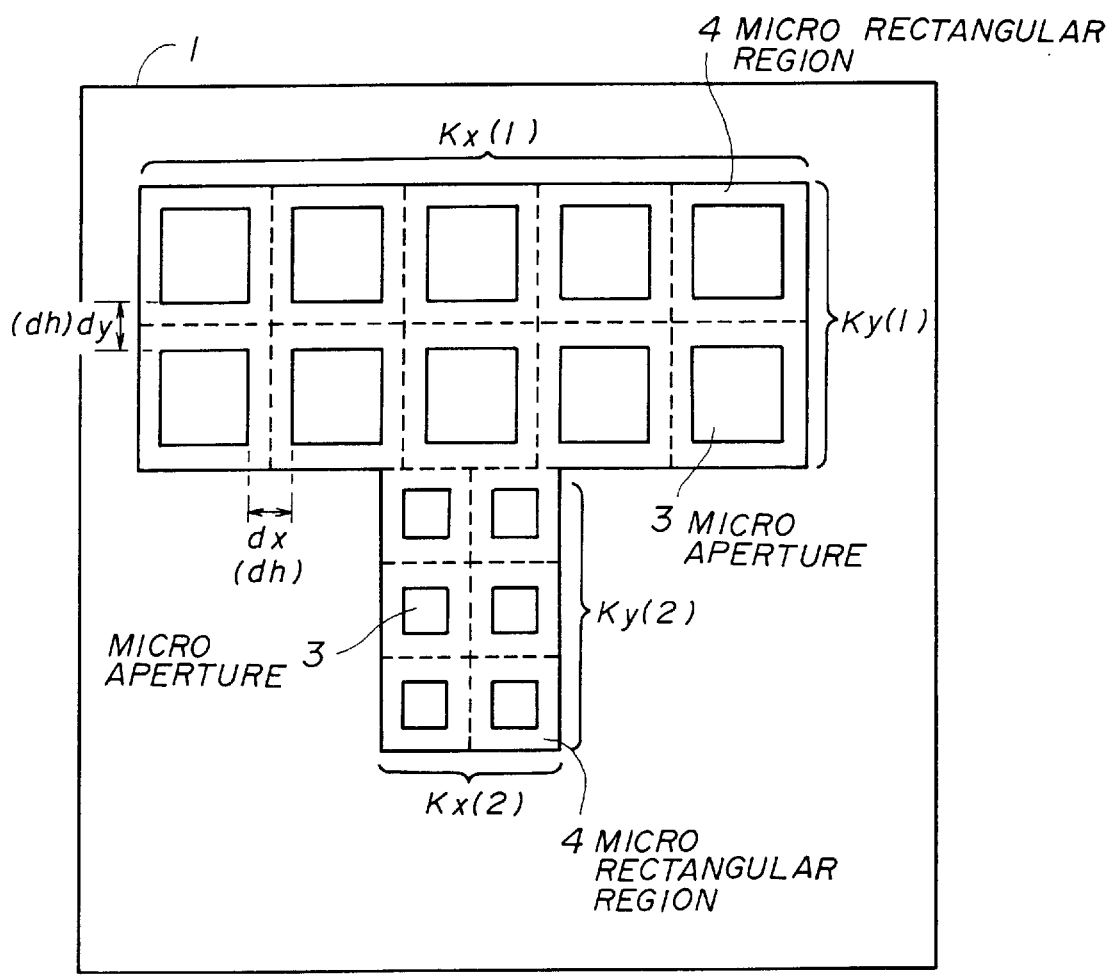

FIGS. 4A and 4B are illustrative drawings for explaining a first principle of the present invention. FIG. 4A shows an example of an ordinary aperture in a block. According to the first principle of the present invention, masking beams are inserted into the aperture as shown in FIG. 4B. With these masking beams, the current amount of an electron beam passing through the aperture can be reduced without changing an exposure pattern on a wafer.

A pattern exposure block 1 (hereafter, "block") of FIG. 4A includes an aperture 2. The aperture 2 includes two rectangular portions $L_1$ and $L_2$. A size of the rectangular portion $L_1$ is $L_x(1) \times L_y(1)$, and a size of the rectangular portion $L_2$ is $L_x(2) \times L_y(2)$. In the first principle of the present invention, instead of creating the aperture 2 of FIG. 4A, a plurality of micro apertures 3 of FIG. 4B are created to constitute the same pattern as that of the aperture 2 of FIG. 4A.

Figure 5:
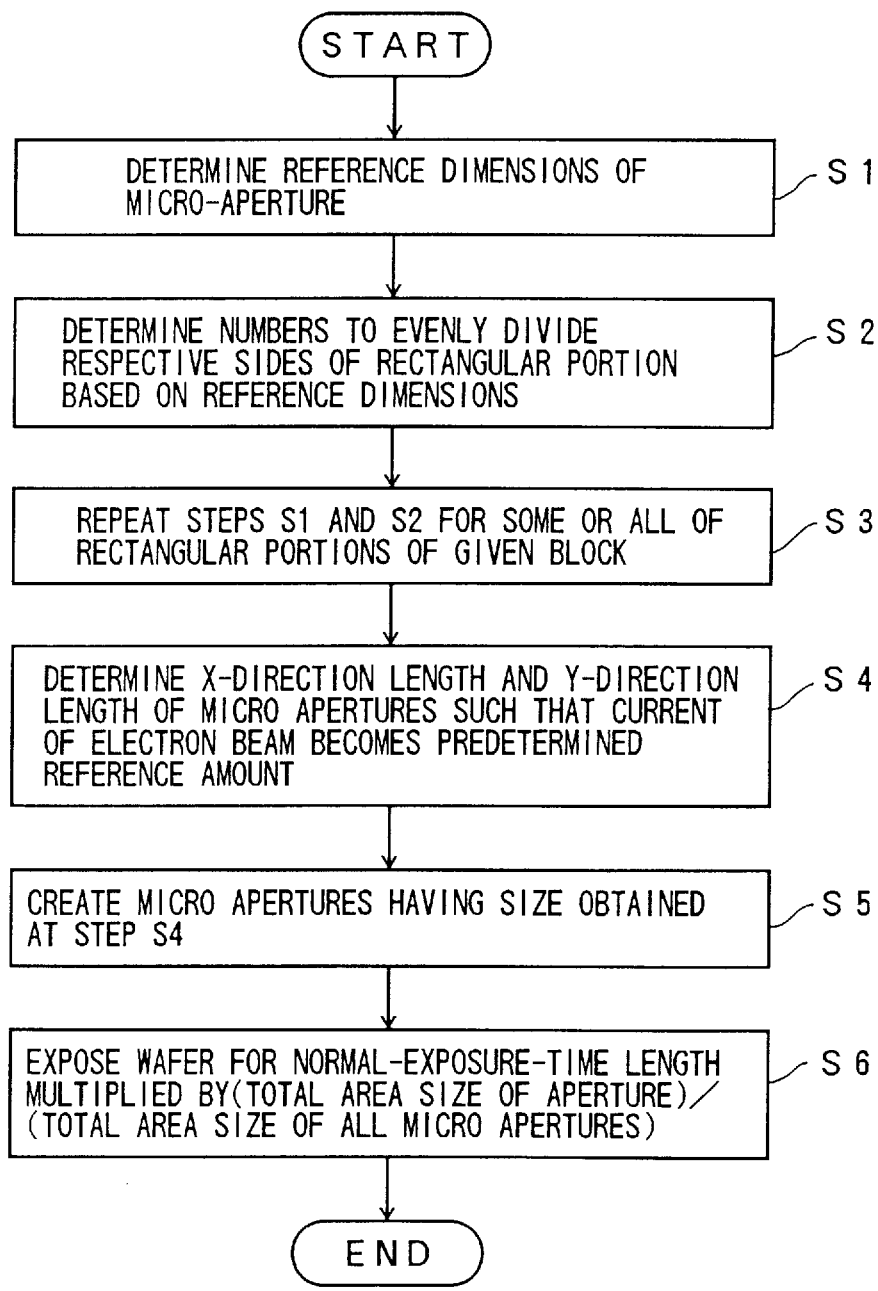
FIG. 5 is a flowchart of a process of creating a micro-aperture pattern and of exposing a wafer by using the micro-aperture pattern according to a first embodiment of the first principle of the present invention.

FIG. 5 is a flowchart of a process of creating a micro-aperture pattern and of exposing a wafer by using the micro-aperture pattern according to a first embodiment of the first principle of the present invention. The process of FIG. 5 is carried out by the electron-beam-exposure device of FIG. 1 according to the first embodiment of the first principle of the present invention.

At a step S1, reference dimensions $M_x$ and $M_y$ of the micro aperture 3 are determined.

At a step S2, numbers $k_x(1)$ and $k_y(1)$ which evenly divide respective sides of the rectangular portion $L_1$ are determined based on the reference dimensions $M_x$ and $M_y$. The numbers $k_x(1)$ and $k_y(1)$ are obtained as:

$$k_x(1) = [L_x(1)/M_x] \quad (1)$$

$$k_y(1) = [L_y(1)/M_y] \quad (2)$$

wherein [z] means rounding z to the closest integer larger than z.

Figure 6:
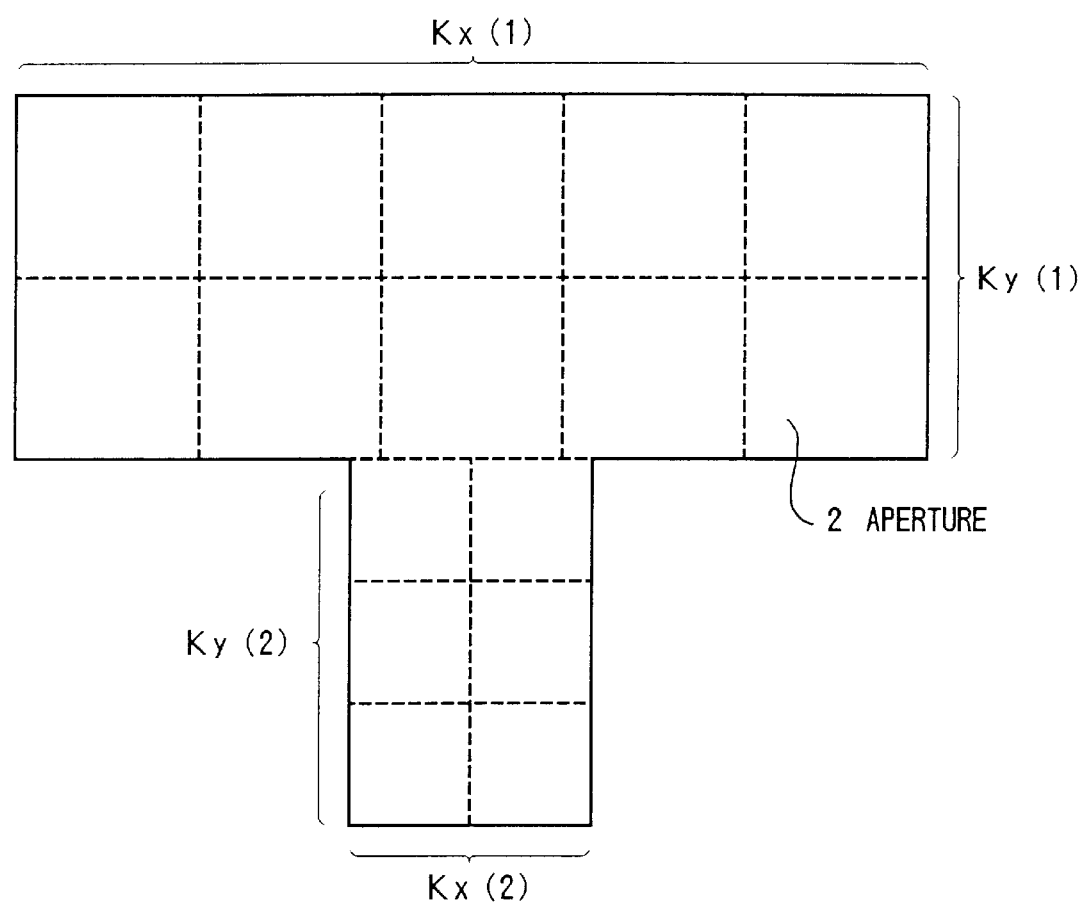
FIG. 6 is an illustrative drawing showing rectangular portions evenly divided by obtained numbers.

At a step S3, the processes of the steps S1 and S2 are repeated for some or all of rectangular portions of a given block. In the example of FIGS. 4A and 4B, numbers $k_x(2)$ and $k_y(2)$ which evenly divide respective sides of the rectangular portion $L_2$ are determined. FIG. 6 is an illustrative drawing showing rectangular portions evenly divided by the obtained numbers.

Figure 7:
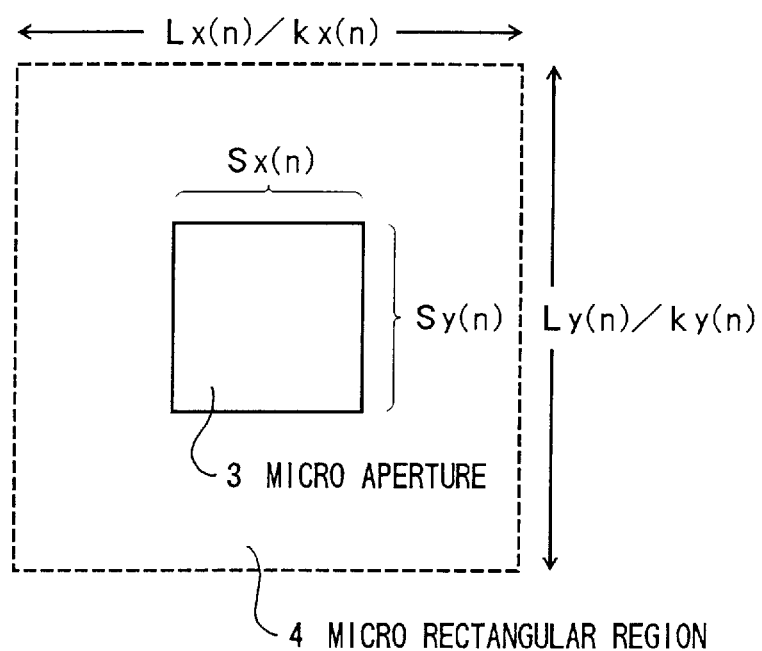
FIG. 7 is an illustrative drawing showing a micro aperture created according to the first embodiment of the first principle.

At a step S4, an x-direction length $S_x(n)$ and a y-direction length $S_y(n)$ of the micro apertures 3 are determined such that a current of an electron beam passing through all the micro apertures 3 becomes a predetermined reference amount. Here, influence of the Coulomb interaction can be ignored at the predetermined reference amount of the electric current. FIG. 7 is an illustrative drawing showing the micro aperture 3 created in this manner.

$S_x(n)$ and $S_y(n)$ can be obtained as follows. A reference current amount $A_{ref}$ at which the Coulomb interaction can be ignored is represented as:

$$A_{ref}[\mu A] = D[\mu A/\mu m^2] \times \{\text{aperture area size}\} \times \alpha \quad (3)$$

where the aperture area size is an area size of the imaginary aperture 2 with no inserted masking beams (FIG. 4A), and D is current density. Also, $\alpha$ is a coefficient used for adjusting the current amount, and shows how much the imaginary aperture area size should be reduced, to lower the current amount down to the reference current amount $A_{ref}$. For example, when the current density D is 0.4 $\mu A/\mu m^2$ and the aperture area size is 5 $\mu m \times 5$ $\mu m$, the current amount is 10 $\mu A$. A current of this amount will result in a large Coulomb interaction. Thus, it is desirable to reduce the current to an amount less than 2.5 $\mu A$ more or less, i.e., about 25% of the total amount of 10 $\mu A$. In this case, the coefficient $\alpha$ is calculated as 0.25. By using the coefficient $\alpha$ for reducing the current amount, $S_x(n)$ and $S_y(n)$ are obtained as:

$$S_x(n) = \alpha^{1/2} \cdot L_x(n)/k_x(n) \quad (4)$$

$$S_y(n) = \alpha^{1/2} \cdot L_y(n)/k_y(n) \quad (5)$$

Here, a region defined by $L_x(n)/k_x(n) \times L_y(n)/k_y(n)$ is a region in which the micro aperture 3 is to be created, and is hereinafter called a micro rectangular region 4 (see FIGS. 4A and 4B and FIG. 7). Namely, in the equations (4) and (5), the micro aperture 3 is obtained by multiplying a x-direction length and a y-direction length of the micro rectangular region 4 by $\alpha^{1/2}$ for each of the rectangular portions $L_1$ and $L_2$. By doing so, a total area size of all the micro apertures 3 provided in a rectangular portion is $\alpha$ times as much as an area size of the rectangular portion for each of $L_1$ and $L_2$. Further, an x-direction masking beam width dx and a y-direction masking beam width dy are represented as:

$$dx(n) = L_x(n)/k_x(n) - S_x(n) \quad (6)$$

$$dy(n) = L_y(n)/k_y(n) - S_y(n) \quad (7)$$

At a step S5, $k_x(n) \times k_y(n)$ micro apertures 3 having a size obtained at the step S4 are created in the aperture mask (see FIG. 4B).

In this manner, the block 1 having a micro-aperture pattern is created. The rest of the steps in FIG. 5 show a process of exposing a wafer by using the created blocks 1.

At a step S6, using the block 1 having a micro-aperture pattern (block with inserted masking beams), a wafer is exposed for a normal exposure time period multiplied by (total area size of aperture)/(total area size of all micro apertures). When $\alpha$ is 0.25 and the total area size of all the micro apertures 3 is 0.25 times as large as that of the (no-inserted masking beam) aperture 2, a wafer is exposed four times (1/0.25) as long as the normal exposure time period.

In the first embodiment of the first principle, a value of $\alpha$ can vary from block to block. Namely, $\alpha$ is closer to 1 when the area size of the aperture 2 with no inserted masking beam is relatively small, and becomes smaller as the area size of the aperture 2 increases (the Coulomb interaction increases). In this manner, a total area size of all the micro apertures 3 can be set to an appropriate size for each block 1, so that a reduction in the throughput caused by an increase in the exposure time can be sustained at a minimum level.

In the first embodiment of the first principle of the present invention, sizes of the micro apertures 3 are determined, based on the coefficient α (area-size-contraction ratio) which is variable for each block 1, and micro-aperture patterns are created in the aperture mask to form desired exposure patterns. Use of these micro-aperture patterns with an exposure time increased by a predetermined time period allows an exposure process substantially free from influence of the Coulomb interaction. In this exposure process, a reduction in the throughput is minimized, and device operation is not unstable.

A process of creating a micro-aperture pattern according to a second embodiment of the first principle of the present invention will be described below. The process of creating a micro-aperture pattern according to the second embodiment differs from that of the first embodiment in the method of determining inserted masking beam widths. In the second embodiment, a masking beam width dh is determined such that it becomes the same in the x direction and in the y direction.

Figure 8:
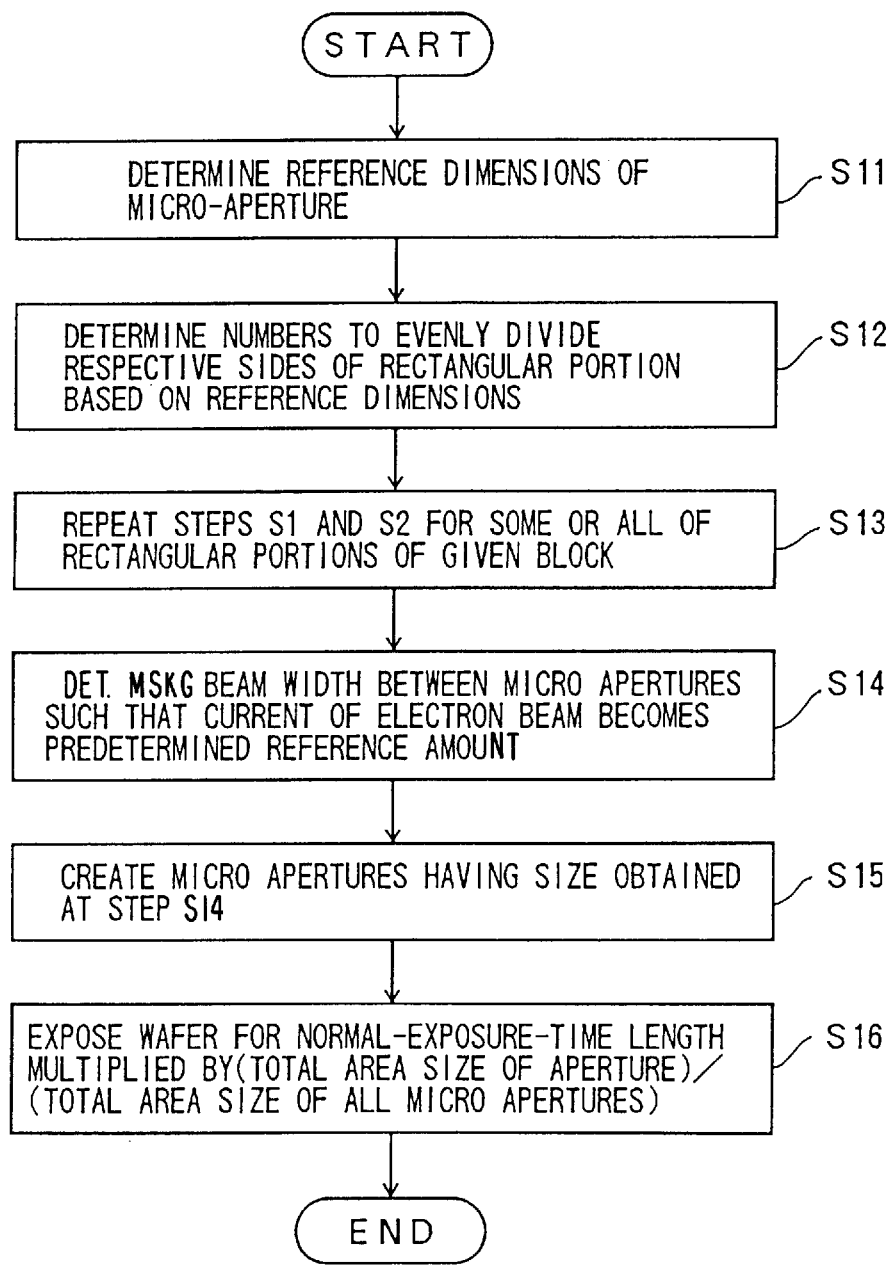
FIG. 8 is a flowchart of a process of creating a micro-aperture pattern and of exposing a wafer by using the micro-aperture pattern according to a second embodiment of the first principle.

FIG. 8 is a flowchart of a process of creating a micro-aperture pattern and of exposing a wafer by using the micro-aperture pattern according to the second embodiment. The process of FIG. 8 is carried out by the electron-beam-exposure device of FIG. 1 according to the second embodiment of the first principle of the present invention.

At a step S11, reference dimensions $M_x$ and $M_y$ of the micro aperture 3 are determined.

At a step S12, numbers $k_x(1)$ and $k_y(1)$ which evenly divide respective sides of the rectangular portion $L_1$ are determined based on the reference dimensions $M_x$ and $M_y$. The numbers $k_x(1)$ and $k_y(1)$ are obtained as:

$$k_x(1) = [L_x(1)/M_x] \quad (8)$$

$$k_y(1) = [L_y(1)/M_y] \quad (9)$$

wherein [z] means rounding z to the closest integer larger than z.

At a step S13, the processes of the steps S11 and S12 are repeated for some or all of rectangular portions of a given block. In the example of FIGS. 4A and 4B, numbers $k_x(2)$ and $k_y(2)$ which evenly divide respective sides of the rectangular portion $L_2$ are determined.

At a step S14, a masking beam width dh(n) between the micro apertures 3 is determined such that a current of an electron beam passing through all the micro apertures 3 becomes a predetermined reference amount. Here, influence of the Coulomb interaction can be ignored at the predetermined reference amount. The beam width dh(n) is the same for the x direction and the y direction.

The beam width dh(n) (i.e., double the width of a masking beam disposed about the periphery of an individual micro-aperture 3), can be obtained as follows. An x-direction dimension $m_x(n)$ and a y-direction dimension $m_y(n)$ of the micro rectangular region 4 are represented as:

$$m_x(n) = L_x(n)/k_x(n) \quad (10)$$

$$m_y(n) = L_y(n)/k_y(n) \quad (11)$$

The coefficient α for the current amount adjustment is obtained by using $m_x(n)$, $m_y(n)$, and dh(n) as:

$$\alpha = (m_x(n) - dh(n))(m_y(n) - dh(n))/m_x(n) \cdot m_y(n) \quad (12)$$

dh(n) is obtained from the equation (12) by solving the second order equation of dh(n).

$$dh(n) = \{m_x(n) + m_y(n) \pm [(m_x(n) + m_y(n))^2 - 4m_x(n)m_y(n)(1-\alpha)]^{1/2}\}/2 \quad (13)$$

Of the two solutions of the equation (13), a positive real number is used as dh(n).

At a step S15, $k_x(n) \times k_y(n)$ micro apertures 3 having a size obtained at the step S14 are created in the aperture mask.

In this manner, the block 1 having a micro-aperture pattern is created. The rest of the steps in FIG. 8 show a process of exposing a wafer by using the created blocks 1.

At a step S16, using the block 1 having a micro-aperture pattern (block with inserted beams), a wafer is exposed for a normal exposure time period multiplied by (total area size of aperture)/(total area size of all micro apertures). When α is 0.25 and the total area size of all the micro apertures 3 is 0.25 times that of the (no-inserted masking beam) aperture 2, a wafer is exposed for four times (1/0.25) as long as the normal exposure time period.

In the second embodiment of the first principle, a value of α can vary from block to block as in the first embodiment. Thus, a reduction in the throughput caused by an increase in the exposure time can be sustained at a minimum level.

In the second embodiment of the first principle of the present invention, masking beam widths are determined based on the coefficient α (area-size-contraction ratio) which is variable for each block 1, and micro-aperture patterns are created in the aperture mask to form desired exposure patterns. Use of these micro-aperture patterns with an exposure time increased by a predetermined time period, allows an exposure process substantially free from influence of the Coulomb interaction. In this exposure process, a reduction in the throughput is minimized, and operation of the device is not unstable.

Figure 9:
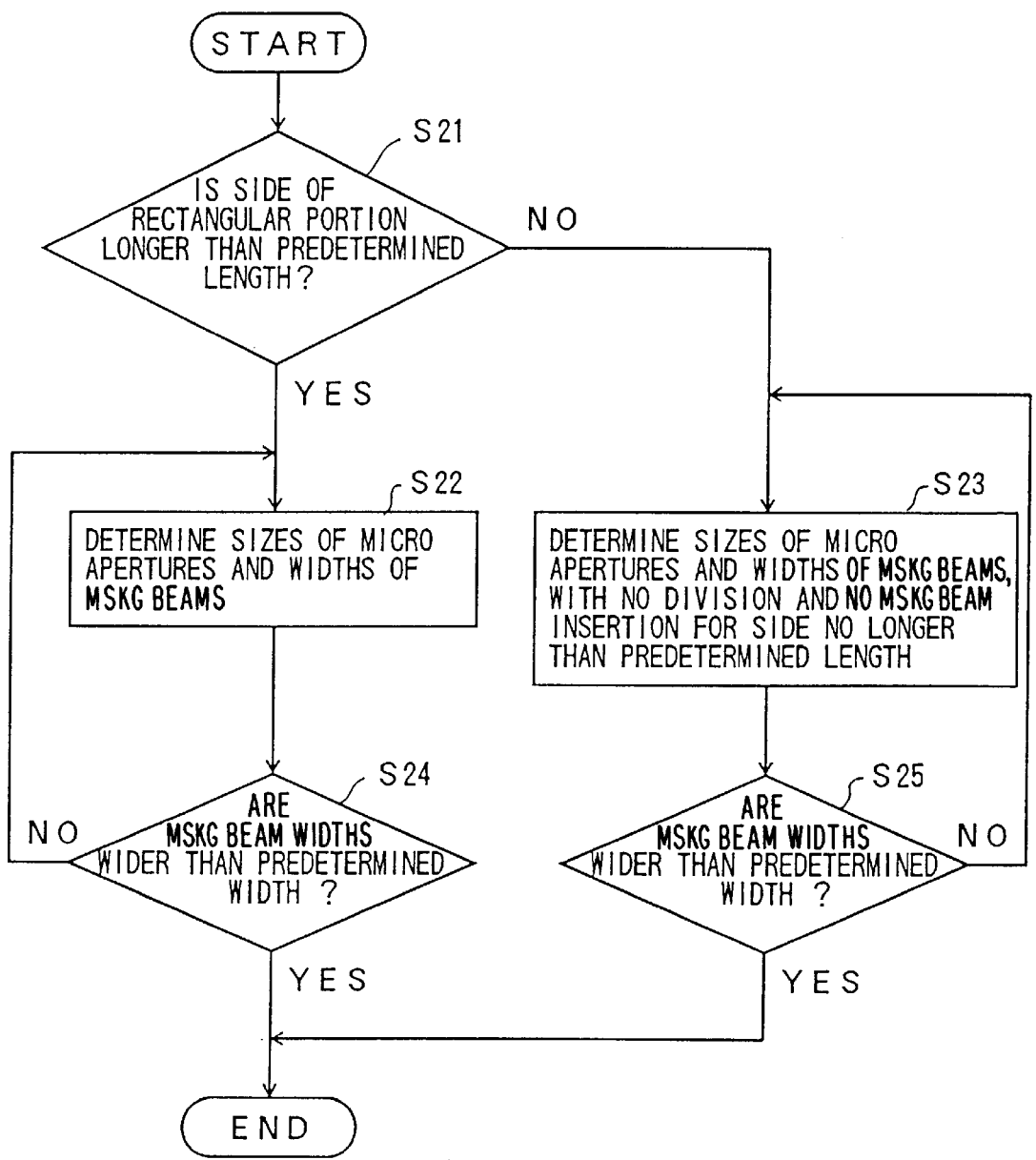
FIG. 9 is a flowchart of a process of creating micro apertures according to a third embodiment of the first principle.

FIG. 9 is a flowchart of a process of creating micro apertures according to a third embodiment of the first principle of the present invention. The third embodiment is concerned with a process of creating micro apertures in which masking beam widths, or sizes of micro apertures, determined in the first embodiment or the second embodiment, respectively, satisfy predetermined criteria. The process of FIG. 9 is carried out by the electron-beam-exposure device of FIG. 1 according to the third embodiment of the first principle of the present invention.

Figure 10A:
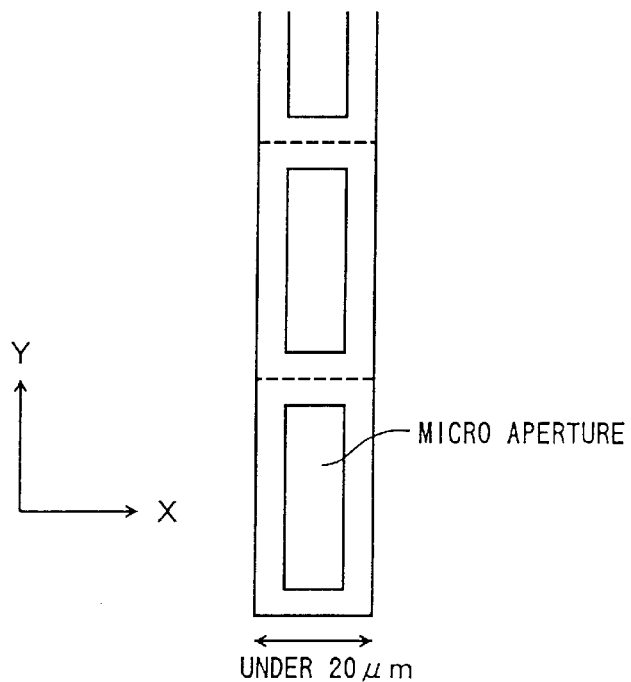
FIGS. 10A and 10B are illustrative drawings showing criteria used for inserting masking beams in the third embodiment of the first principle.
Figure 10B:
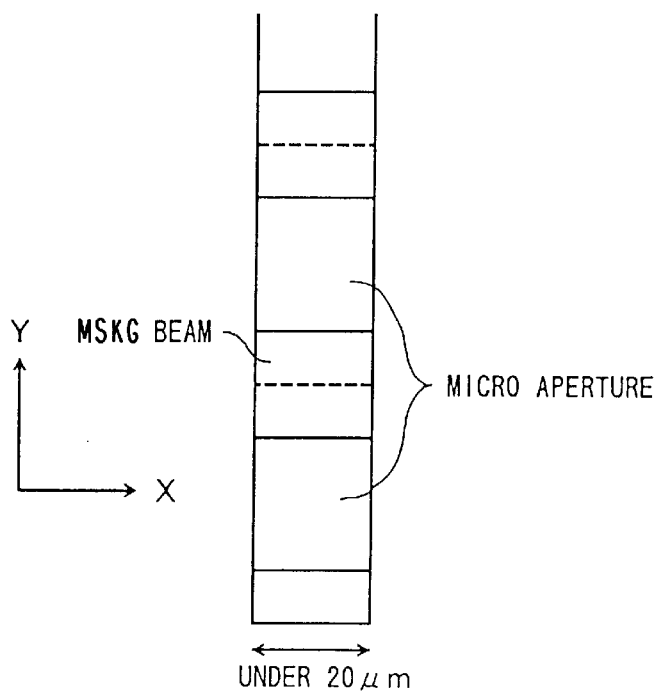

If the shortest side of the micro aperture 3 is extremely short, an electron beam passing through the hole becomes too narrow to form an appropriate pattern on a wafer. When the shortest side of a given rectangular portion is less than 20 μm (0.2 μm on the wafer), for example, it is preferable not to divide the rectangular portion in the direction of the shortest side and not to insert masking beams. FIGS. 10A and 10B are illustrative drawings showing criteria used for inserting masking beams. When a side extending in the x direction of the rectangular portion is less than 20 μm as shown in FIG. 10A, masking beams are not inserted in the x direction, as shown in FIG. 10B. Whereas, in the direction of the other side (y direction), the rectangular portion is divided and masking beams are inserted.

Moreover, when a width of a created beam is extremely narrow, there is an increased likelihood that the beam is easily damaged. Therefore, the beam width is preferably wider than 2 μm, for example.

In FIG. 9, at a step S21, a check is made whether each side of a rectangular portion to be provided with masking beams is longer than a predetermined length. If the answer is "yes", the procedure goes to a step S22. If the answer is "no", the procedure goes to a step S23.

At the step S22, sizes of the micro apertures 3 and widths of masking beams to be created are obtained.

At the step S23, sizes of the micro apertures 3 and widths of masking beams to be created are obtained. Here, no masking division is carried out and no beams are inserted in a direction of a side not longer than the predetermined length.

At a step S24 and a step S25, a check is made whether obtained beam widths are wider than a predetermined width. If they are, the procedure ends. If the masking beam widths are narrower than a predetermined width, the reference pitch $M_x$ or $M_y$ is increased (the division pitch is made wider) before going back to the step S22 or the step S23.

By carrying out the process as described above, the micro apertures 3 are created such that micro-aperture sizes and masking beam widths satisfy the predetermined criteria.

In the third embodiment of the first principle of the present invention, the micro apertures 3 created in the first embodiment are prevented from becoming too narrow to be suitable for an exposure process, and masking beams created in the second embodiment are prevented from becoming too thin to be sufficiently sturdy. Therefore, a block mask which can be reliably used in the exposure process is obtained.

As described above, according to the first principle of the present invention, a block is provided with micro apertures having area sizes smaller than those of corresponding micro rectangular regions, where these micro rectangular regions collectively form a desired pattern. Thus, the total area size of the micro apertures can be made smaller than a predetermined size, so that a current amount of an electron beam passing through these micro apertures is reduced so as to substantially prevent Coulomb interaction.

Also, according to the first principle of the present invention, a pattern is divided into one or more rectangular portions, and micro rectangular regions are defined within each of these rectangular portions. Thus, micro rectangular regions are easily defined.

Also, according to the first principle of the present invention, respective area sizes of the micro apertures are the same with respect to each other (i.e., are of a common size) in a given rectangular portion. Therefore, area sizes of the micro apertures for achieving a desired current amount can be easily obtained.

Also, according to the first principle of the present invention, the micro apertures are rectangular, and x-direction sides and y-direction sides are respectively identical with each other in a given rectangular portion. Therefore, area sizes of the micro apertures for achieving a desired current amount can be easily obtained.

Also, according to the first principle of the present invention, the micro apertures are rectangular, and widths of masking beams are the same with each other and the same in the x direction and in the y direction in a given rectangular portion. Therefore, area sizes of the micro apertures for achieving a desired current amount can be easily obtained.

Also, according to the first principle of the present invention, masking beam widths between the micro apertures are wider than a predetermined width (e.g., 2 $\mu$m). Therefore, masking beams are prevented from being easily damaged.

Also, according to the first principle of the present invention, when one side of a given rectangular portion is shorter than a predetermined length (e.g., 20 $\mu$m), a division into micro rectangular regions is not carried out, and micro apertures having a side length equal to that of the side of the given rectangular portion are created. Therefore, a situation in which a pattern cannot be exposed because of too narrow apertures is avoided.

Also, according to the first principle of the present invention, a wafer is exposed for {pattern area size/total area size of micro apertures} times as long as the normal exposure time. Thus, the wafer is reliably exposed with a decreased current amount.

In the following, a second principle of the present invention and embodiments thereof will be described with reference to the accompanying drawings.

Figure 11A:
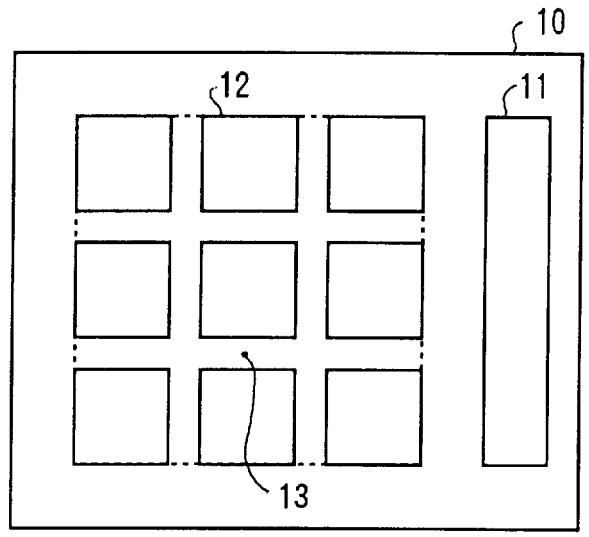
FIGS 11A and 11B are illustrative drawing showing a second principle of the present invention.
Figure 11B:
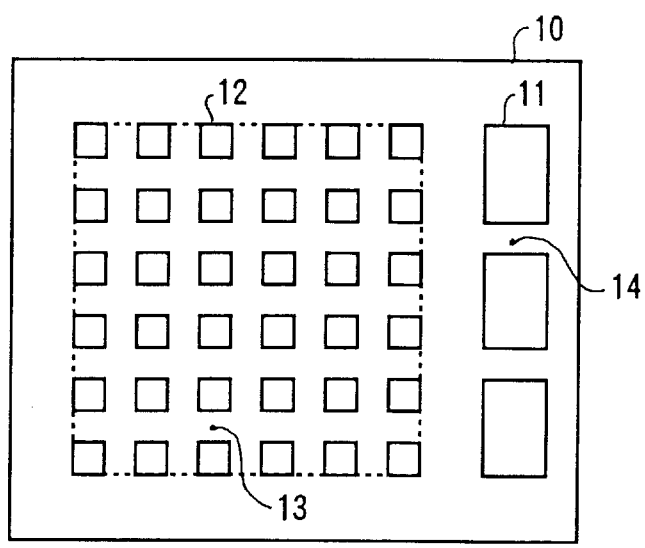

FIGS. 11A and 11B are illustrative drawing showing the second principle of the present invention. In the second principle, an exposure amount for a given block is set to an exposure amount appropriate for a particular aperture (i.e., an aperture most likely to be under-exposed) within the given block. When an exposure amount is set according to this criterion, however, other apertures having relatively larger area sizes are over-exposed so that an appropriate pattern is not created. In order to avoid this, according to the second principle of the present invention, masking beams are inserted in the apertures having relatively larger area sizes, thereby reducing a current amount of the electron beam passing through these apertures.

A block 10 of FIG. 11A includes an aperture 11, an aperture 12 (a set of micro apertures), and masking beams 13 inserted in the aperture 12. An exposure amount for the block 10 is determined by using as a reference the aperture 11 which is most likely to be under-exposed. The masking beams 13 are inserted in the aperture 12 such that the aperture 12 is appropriately exposed by using the exposure amount set for the aperture 11. The masking beams 13 are so narrow that projections of the beams 13 do not appear as an exposure pattern on a wafer. Thus, an intended pattern of the aperture 12 is drawn as an exposure pattern on the wafer.

In FIG. 11B, beams 14 are inserted also in the aperture 11. These beams 14 are inserted so as to sufficiently lessen influence of the Coulomb interaction. When the block 10 of FIG. 11A is exposed at an exposure amount determined according to the second principle of the present invention, a current amount of an electron beam passing through the aperture 11 and the aperture 12 may still be large enough to incur an undesirable Coulomb interaction. In this case, the masking beams 14 are inserted into the aperture 11, and the number of the masking beams 13 in the aperture 12 is increased, as shown in FIG. 11B, thereby reducing the current amount of the electron beam.

The reason why the masking beams 14 are inserted into the aperture 11 in addition to the increase of the masking beams 13 in the aperture 12 is as follows. In FIG. 11A, as described above, the exposure amount is appropriate for both the aperture 11 and the aperture 12 with the beams 13. When the number of the masking beams 13 in the aperture 12 is increased in order to lessen the influence of the Coulomb interaction, the balance between the aperture 11 and the aperture 12 is lost so that an exposure amount becomes inappropriate for either the aperture 11 or the aperture 12. According to the second principle of the present invention, under an undesirably large influence of the Coulomb interaction, masking beams are inserted into both the aperture 11 and the aperture 12 to reduce a current amount of the passing electron beam.

According to the second principle of the present invention described above, an exposure amount is set in accordance with an aperture most likely to be under-exposed, so that even the finest pattern is appropriately created without suffering from an under-exposure. Also, apertures of patterns to be overexposed at this exposure amount are inserted with the masking beams, so that even the larger patterns are properly created without suffering from an over-exposure. Further, when the influence of the Coulomb interaction is undesirably large, masking beams are inserted into all apertures without losing the balance between the apertures to reduce the influence of the Coulomb interaction. Thus, appropriate patterns are created. Therefore, according to the second principle of the present invention, a fine pattern of an aperture having a relatively small area size is exposed at an appropriate exposure amount with the influence of the Coulomb interaction being reduced.

The above description of the second principle of the present invention has been provided with reference to a case with two apertures in one block. However, it is apparent that the second principle of the present invention is applicable to cases with more than two apertures provided in one block.

Figure 12:
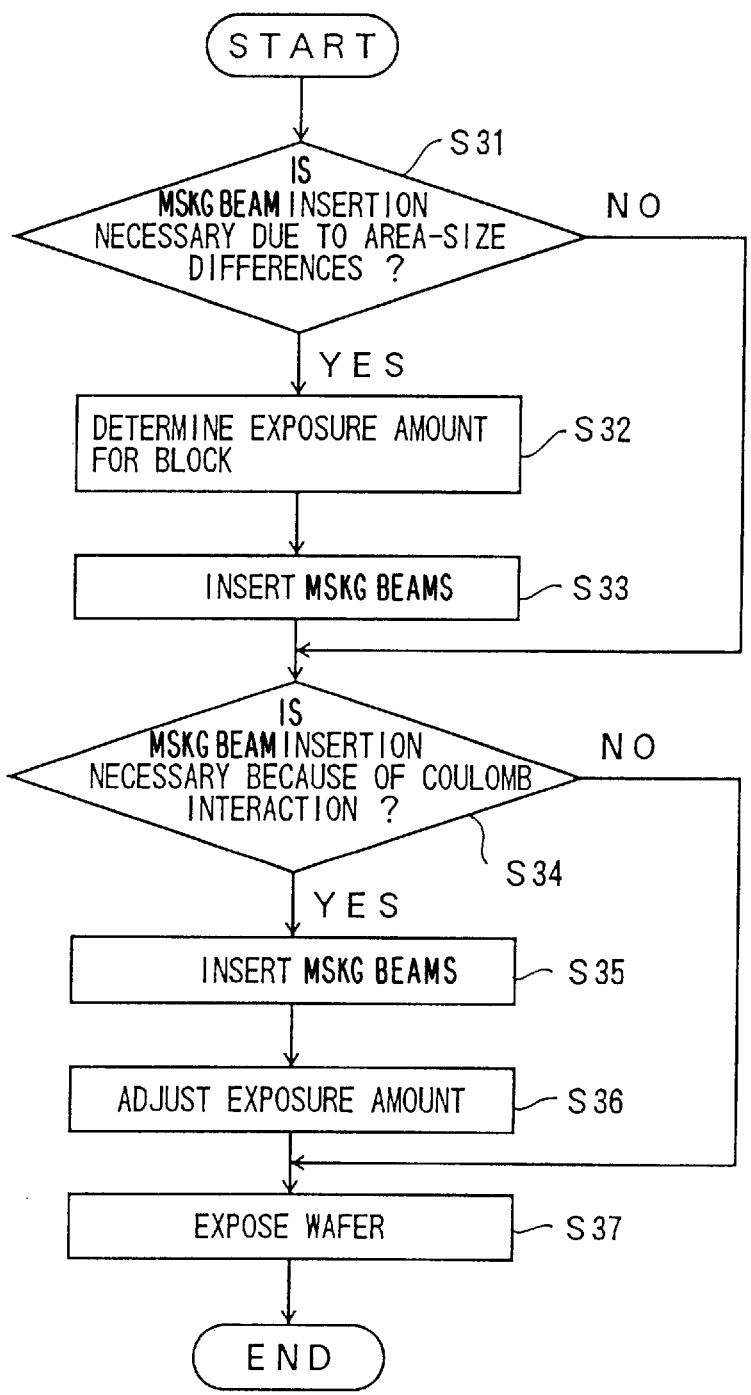
FIG. 12 is a flowchart of an exposure process based on beam insertion and exposure amount adjustment according to a first embodiment of the second principle of the present invention.

FIG. 12 is a flowchart of an exposure process based on an beam insertion and an exposure amount adjustment according to a first embodiment of the second principle of the present invention. The exposure process of FIG. 12 is carried out by the device of FIG. 1 according to the first embodiment of the second principle.

Figure 13A:
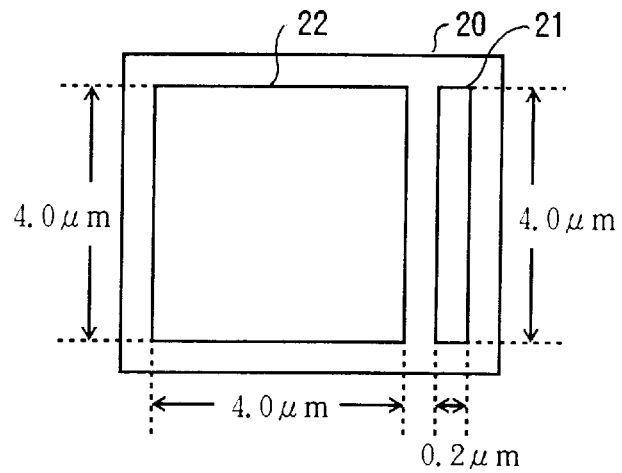
FIGS. 13A through 13C are illustrative drawings showing examples of masking beam inserted patterns.
Figure 13B:
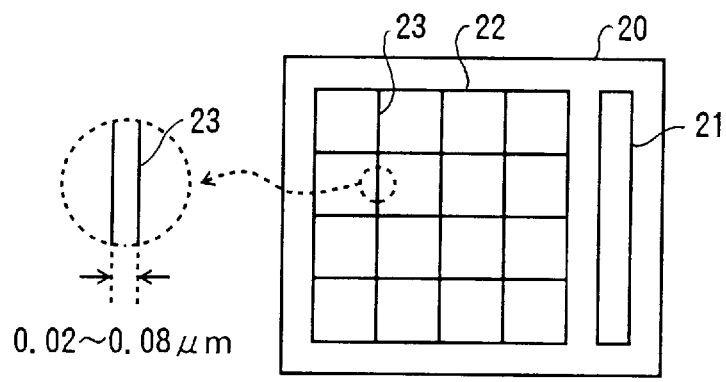
Figure 13C:
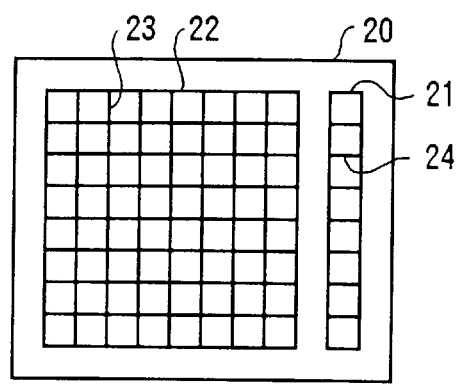

FIGS. 13A through 13C are illustrative drawings showing examples of masking beam inserted patterns. The exposure process based on the beam insertion and the exposure amount adjustment according to the first embodiment of the second principle will be described with reference to FIG. 12 and FIGS. 13A through 13C.

At a step S31, a check is made whether differences in area sizes between apertures are greater than a predetermined amount so that a masking beam insertion is necessary. If the masking beam insertion is necessary, the procedure goes to a step S32. If the masking beam insertion is not necessary, the procedure goes to a step S34.

In a block 20 of FIG. 13A, an aperture 21 has a width of 0.2 $\mu$m and a length of 4.0 $\mu$m, and an aperture 22 is a 4.0-$\mu$m square. Since a difference in area sizes between the aperture 21 and the aperture 22 is large, the aperture 22 needs a beam insertion masking beam insertions in order to achieve appropriate exposures of both the aperture 21 and the aperture 22. In general, when the smallest aperture (aperture 21) has a width smaller than 0.3 $\mu$m and a larger aperture (aperture 22) has an area size three times as large as that of the smallest aperture, the lager aperture needs a masking beam insertion.

At a step S32, an exposure amount for the block is determined. In detail, the exposure amount for the block is determined to be an exposure amount for the smallest aperture to be appropriately exposed. In order to determine the exposure amount, both a current density and an exposure time need to be decided. Therefore, when the current density of an electron beam for exposure is constant, the exposure amount is defined by adjusting the exposure time.

In the example of FIG. 13A, an exposure amount of the block 20 is set to such an exposure amount that the aperture 21 is appropriately exposed with high precision. In general, the exposure amount for the smallest aperture needs to be four times to five times larger than an appropriate exposure amount for a larger aperture. Since an exposure amount actually used for a wafer depends on a sensitivity of a resist, it is difficult to determine the exposure amount through a single set of rules. Therefore, the exposure amount may be determined experimentally by taking into account such a factor as resist sensitivities.

At a step S33, masking beams are inserted. Namely, lest a larger aperture is over-exposed, beams are inserted into the larger apertures to limit a passing current amount to an appropriate level.

As shown in FIG. 13B in this example, masking beams 23 are inserted into the aperture 22. In general, a width of the masking beams 23 ranges from 0.02 $\mu$m to 0.06 $\mu$m. The reason why the width of the masking beams is restricted within this range is because too wide a masking beam may cast its projection as an exposure pattern and too narrow a beam may be easily damaged.

At the step S34, a check is made whether a total area size of the apertures in the block is greater than a predetermined amount so that a masking beam insertion is necessary to obviate influence of the Coulomb interaction present in the passing current. If the masking beam insertion is necessary, the procedure goes to a step S35. If the masking beam insertion is not necessary, the procedure goes to a step S37.

In the example of FIG. 13A, assuming that the current density is 0.4 $\mu$A/$\mu$m$^2$, a current amount of the current passing through the apertures 21 and 22 of the block 20 is 6.72 $\mu$A (=0.4 $\mu$A×4.0 $\mu$m×4.0 $\mu$m+0.4 $\mu$A×0.2 $\mu$m×4.0 $\mu$m). In order to suppress the Coulomb interaction so that an influence thereof can be ignored, the passing current amount is generally required to be less than about 2.5 $\mu$A. (With a 5-$\mu$m square block, for example, influence of the Coulomb interaction becomes intolerable when a total area size of the apertures exceeds 25% of the block area size.) Therefore, when the passing current amount exceeds 2.5 $\mu$A for the block 20 of FIG. 13B with the inserted masking beams, a further beam insertion is necessary to suppress the influence of the Coulomb interaction.

At a step S35, masking beams are inserted. In this case, the smallest aperture and the larger apertures are kept at an appropriate exposure-amount condition, so that masking beams are inserted into all the apertures.

As shown in FIG. 13C of this example, beams 23 and 24 are inserted into the apertures 22 and 21, respectively. After this beam insertion, a current passing through the block 20 of FIG. 13C is limited under 2.5 $\mu$A, so that the influence of the Coulomb interaction can be ignored.

At a step S36, an exposure amount is adjusted. Since the further masking beam insertion is conducted at the Step S35, the exposure amount determined at the step S32 will result in an under-exposure for both the smallest aperture and the larger apertures. An appropriate exposure amount for the entirety of the patterns should be decided again by increasing an exposure amount. In this case, increasing the current density will result in a regeneration of an intolerable influence of the Coulomb interaction. Thus, an appropriate exposure amount is obtained by increasing the exposure time without increasing the current density.

Assume that, in the example of FIG. 13C, the total area size of the apertures is 0.4 times as large as that of FIG. 13B. In general, multiplying an exposure time by 1/0.4 will give an appropriate exposure time.

At the step S37, an exposure process is carried out. That is, a block mask is created by using the block 20 of FIG. 13C, and a wafer is exposed by using the appropriate exposure time determined at the step S36 and the current density determined at the step S32. This ends the procedure.

As described above, according to the second principle of the present invention, even when area sizes are vastly different between the apertures in a given block, the masking beam insertion ensures that all the apertures are exposed at an appropriate exposure amount with a high precision. Also, influence of the Coulomb interaction is suppressed to create exposure patterns with a further increased precision.

The first embodiment of the second principle has been described in the above with reference to a case with two apertures provided in one block. However, it is apparent that the second principle of the present invention is applicable to cases with more than two apertures provided in one block.

Figure 1:
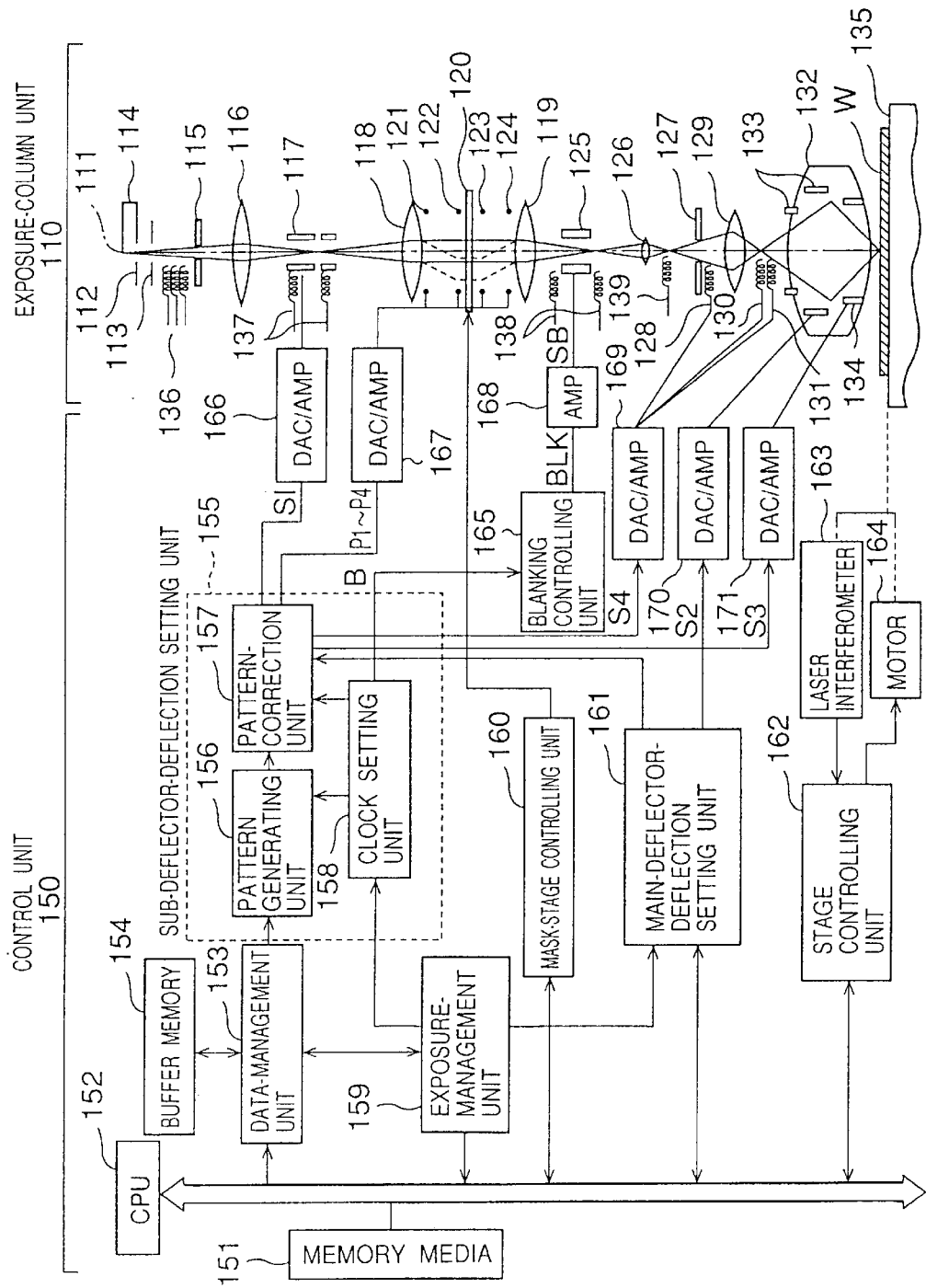
FIG. 1 is a block diagram of an example of an electron-beam-exposure device of the block-exposure type of the prior art.
Figure 2A:
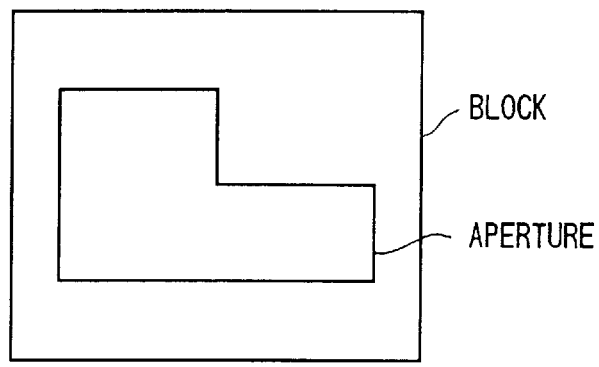
FIG. 2A and 2B are illustrative drawings showing examples of blocks having an aperture of a different area size.
Figure 2B:
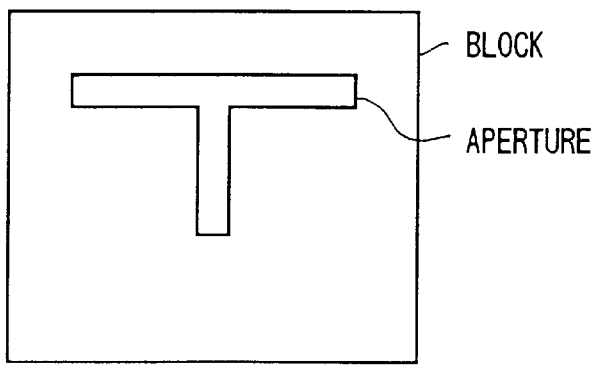
Figure 3:
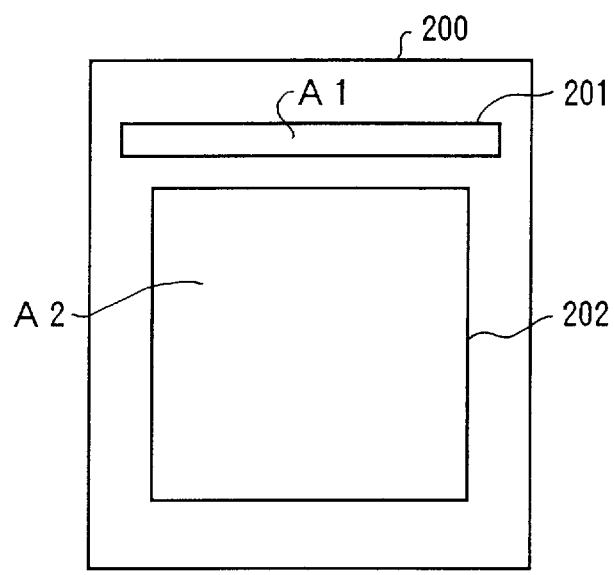
FIG. 3 is an illustrative drawing showing a block and an aperture pattern within the block for explaining a problem concerning an exposure amount adjustment in the electron-beam-exposure device of FIG. 1.

In the flowchart of FIG. 12 described above, the exposure process of the step S37 is carried out by the entirety of the device of FIG. 1, and the other processes are carried out by the CPU 152 of FIG. 1. Also, the masking beam insertion described above corresponds to a generation of the mask-generation data, which is used for creating the apertures with the inserted masking beams. Namely, the mask-generation data is used for creating an actual mask.

FIG. 14 is a table chart showing a data table for explaining an alternate example of the first embodiment of the second principle. In this alternate example, the exposure amount adjustment of the step S36 of FIG. 12 is carried out based on values obtained through experiments in advance. Other processes are the same as those of the flowchart of FIG. 12, and a description thereof will be omitted.

FIG. 14 shows appropriate exposure amounts when one to five masking beams with a width ranging from 0.02, 0.03, 0.04, to 0.05 $\mu$m are inserted into an aperture having a width of 0.16 $\mu$m, for example. Here, the number of the inserted masking beams is determined by a length of the aperture. As shown in FIG. 14, when two beams with a 0.02-$\mu$m width are inserted, an exposure amount should be 1.017 times longer than the exposure amount for no beam. By preparing such a table for apertures of various widths, an appropriate exposure amount can be determined for various apertures.

As described above, according to the alternate example of the first embodiment of the second principle, tables listing appropriate exposure amounts for various number of inserted masking beams having various widths are provided for cases in which masking beams are inserted into apertures of various widths, so that an appropriate exposure amount is determined for an aperture with the inserted beams. Therefore, patterns are exposed with increased precision.

Figure 15:
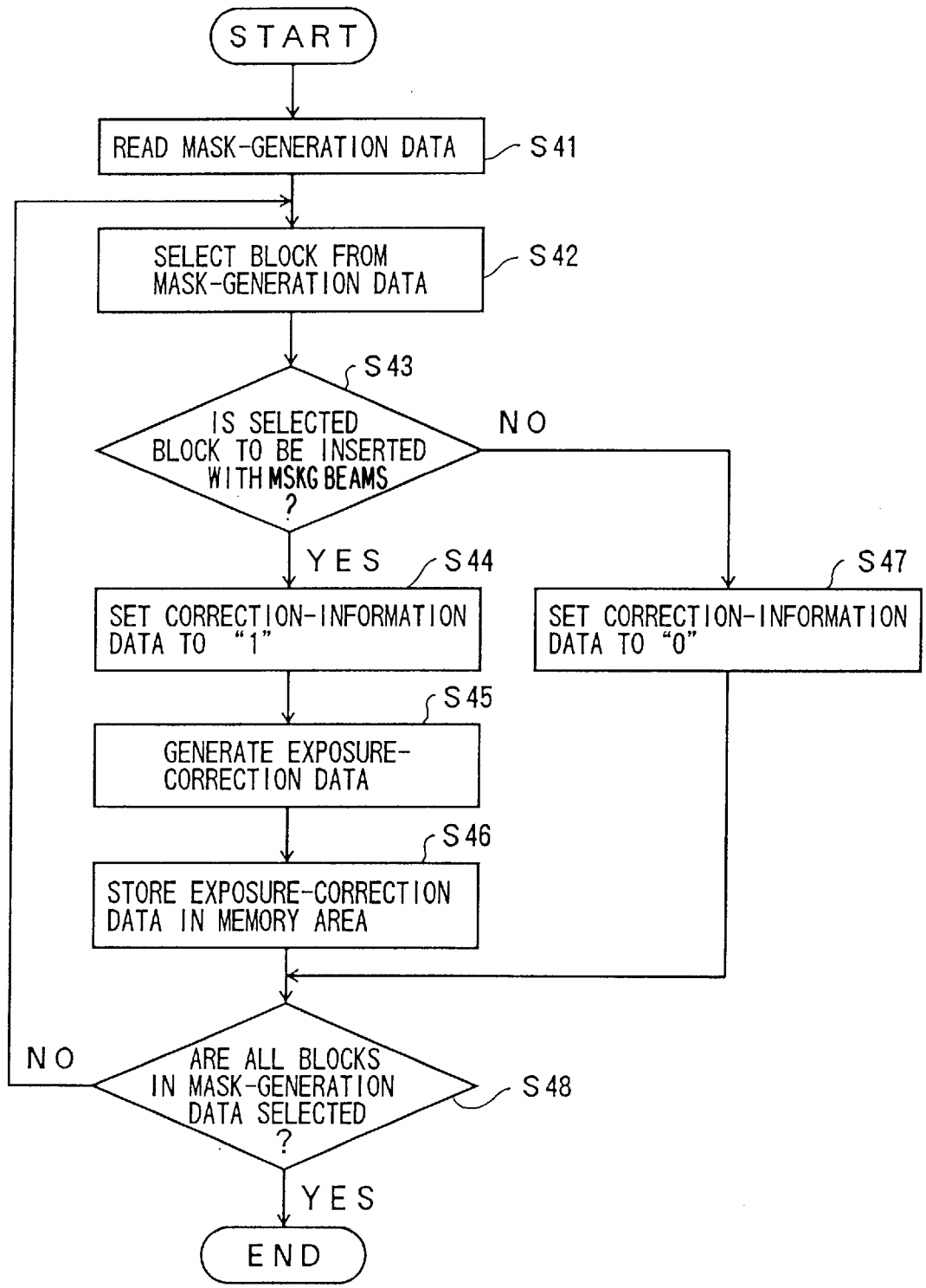
FIG. 15 is a flowchart of a data-generation process for the masking beam insertion and the exposure amount adjustment according to a second embodiment of the second principle of the present invention.

FIG. 15 is a flowchart of a data-generation process for the masking beam insertion and the exposure amount adjustment according to a second embodiment of the second principle of the present invention. The data-generation process of FIG. 15 is carried out by the device of FIG. 1 according to the second embodiment of the second principle. The data-generation process of FIG. 15 helps the device of FIG. 1 to carry out an appropriate exposure process by providing data of an exposure process when the masking beams are inserted, and is used with the first embodiment of the second principle. The data-generation process for the masking beam insertion and the exposure amount adjustment according to the second embodiment of the second principle will be described with reference to FIG. 15.

The first embodiment of the second principle shown in FIG. 12 is concerned with the masking beam insertion and the exposure process as previously described. In order to carry out an exposure process by using the device of FIG. 1, however, the device of FIG. 1 must be provided with data regarding an exposure process with inserted masking beams. In the device of FIG. 1, when a block of the mask 120 is selected for an exposure process, an exposure amount (exposure time) for the selected block is controlled by the exposure-management unit 159. The exposure amount is determined based on exposure-amount data stored in the memory media 151, and this exposure-amount data is created in advance based on the mask-generation data for generating the mask 120. Therefore, when the mask 120 having masking beams inserted by the masking beam insertion process of FIG. 12 is created, the exposure-amount data should be corrected to compensate for a decrease due to the masking beam insertion in area sizes of the apertures.

Namely, when the masking beam-inserted exposure process of the present invention is carried out by the device of FIG. 1, a check should be made whether a block is a masking beam-inserted block or a no-inserted masking beam block at a time when the block is selected from the mask 120 for the exposure process. If the block is a masking beam-inserted block, exposure-amount-correction data for correcting the exposure amount should be used. The flowchart of FIG. 15 shows a process of generating correction-information data indicating existence or a non-exsistence of beams in a given block and of generating the exposure-amount-correction data for correcting the exposure amount. Here, this process is carried out by the CPU 152 of FIG. 1.

In FIG. 15, at a step S41, mask-generation data is read.

At a step S42, a block is selected from the mask-generation data.

At a step S43, a check is made whether the selected block is to be inserted with masking beams. This check may be made based on criteria used at the step S31 and the step S34 of the flowchart of FIG. 12. If beams are to be inserted, the procedure goes to a step S44. If no masking beam is to be inserted, the procedure goes to a step S47.

At the step S44, correction-information data is set to "1", indicating that masking beams are inserted.

At a step S45, exposure-correction data is generated. Namely, the exposure-correction data is generated based on the exposure amount determined at the step S32 or the step S37 of the flowchart of FIG. 12.

At a step S46, the exposure-correction data thus generated is stored in a memory area.

At the step S47 when the check of the step S43 indicates no masking beam insertion, the correction-information data is set to "0", indicating that no masking beam is inserted.

At a step S48, a check is made whether all blocks in the mask-generation data are selected. If there is a block yet to be selected, the procedure goes back to the step S42. If all the blocks are selected and the steps S43 through S46 or the steps S43 and S47 are finished, the procedure ends.

The procedure of FIG. 15 may be carried out in parallel with the procedure of FIG. 12. For example, at the step S45 of FIG. 15, the steps S32 through S36 of FIG. 12 may be carried out.

As described above, according to the data-generation process for the masking beam insertion and the exposure amount adjustment according to the second embodiment of the second principle, the correction-information data indicating existence or non existence of a masking beam in a given block and the exposure-amount-correction data for correcting the exposure amount are generated. Based on the generated data, a check is made whether a block is a masking beam-inserted block inserted masking or a no-inserted masking beam block at a time when the block is selected from the mask for the masking beam-inserted exposure process of the present invention. When the selected block is a masking beam-inserted block, the exposure process is carried out by using the exposure-amount-correction data for correcting the exposure amount.

As described above, according to the second principle of the present invention, an exposure amount is set in accordance with an aperture most likely to be under-exposed, and apertures to be over-exposed at this exposure amount are inserted with the masking beams to adjust the exposure amount thereof. Therefore, the smallest aperture and the larger apertures in the same block are exposed at an appropriate exposure amount, thereby creating exposure patterns with high precision.

Also, according to the second principle of the present invention, the inserted masking beams do not appear in projected patterns, so that desired patterns are exposed on the wafer. Therefore, exposure patterns with a high precision are created.

Also, according to the second principle of the present invention, the inserted masking beams do not appear in projected patterns so as to create desired patterns on the wafer, and the inserted masking beams sustain sufficient strength so as not to be easily damaged. Therefore, exposure patterns with a high precision are created.

Also, according to the second principle of the present invention, when influence of the Coulomb interaction is still present in the electron beam passing through the apertures inserted with masking beams, an area size of the apertures is reduced by further inserting masking beams to decrease the current amount of the electron beam. Therefore, the influence of the Coulomb interaction is reduced to create more precise patterns.

Also, according to the second principle of the present invention, an exposure time for a given block may be automatically determined based on the total area size of the apertures in the given block. Therefore, exposure patterns with a high precision are created.

Also, according to the second principle of the present invention, an exposure process is carried out by using the correction-information data indicating existence or non-existence of an electron beam in a given block and the exposure-amount-correction data for correcting the exposure amount for the given block. Therefore, exposure patterns are created at appropriately corrected exposure amounts, thereby achieving a high precision.

Also, according to the second principle of the present invention, an exposure time for a given block may be determined based on the lists of appropriate exposure amounts provided for various sizes and various numbers of inserted masking beams with respect to various widths of apertures, where the list may be experimentally or theoretically obtained in advance. Therefore, exposure patterns with high precision are created.

Further, the present invention is not limited to these embodiments, but various variations and modifications may be made without departing from the scope of the present invention.

What is claimed is:

1. A mask having a plurality of pattern exposure blocks, an electron beam passing through said at least one aperture of a selected one of said blocks and directed to an object forming a pattern on said object, said mask comprising:

a plate capable of blocking said electron beam; and
   micro rectangular regions forming said pattern on said plate, each of said micro rectangular regions containing one or more respective micro apertures formed therein and extending through said plate, and said one or more of said micro apertures having a total area size smaller than that of said respective micro rectangular region,
   wherein a total area size of said micro apertures is smaller than a predetermined size.

2. The mask as claimed in claim 1, wherein said pattern is defined on said plate as one or more portions each having first and second pairs of sides extending respectively in x and y directions, each of said one or more portions being divided into one or more of said micro rectangular regions in each of said x and y directions.

3. The mask as claimed in claim 2, wherein said micro apertures in a common one of said one or more rectangular portions have a common area size.

4. The mask as claimed in claim 3, wherein said micro apertures are rectangular and have a common side length in said x direction and a common side length in said y direction in one of said one or more rectangular portions.

5. The mask as claimed in claim 3, wherein said micro apertures are rectangles having first and second pairs of sides extending in said x direction and in said y direction, respectively, widths of masking beams between said micro apertures being the same for both said x direction and said y direction.

6. The mask as claimed in claim 1, wherein widths of masking beams between said micro apertures are wider than a predetermined width.

7. The mask as claimed in claim 1, wherein widths of masking beams between said micro apertures are wider than 2 μm.

8. A method of creating a mask having a plurality of blocks defining respective patterns, each block having at least one aperture, an electron beam passing through said at least one aperture of a selected one of said blocks and directed to an object forming a pattern on said object corresponding to the pattern of the respective block, said method comprising the steps of:

a) defining micro rectangular regions forming said pattern on a plate capable of blocking said electron beam; and
   b) creating micro apertures through said plate such that each of said micro rectangular regions has a corresponding one of said micro apertures, each of said micro apertures having an area size smaller than that of a corresponding one of said micro rectangular regions, a total of the respective area sizes of said micro apertures being smaller than a a total area size of said micro rectangular regions.

9. The method as claimed in claim 8, wherein said step a) comprises the steps of:

a1) dividing said pattern into one or more rectangular portions, each portion having one pair of sides extending in an x direction and a second pair of sides extending in a y direction; and
   a2) defining said micro rectangular regions by dividing said one or more rectangular portions into one or more of said micro rectangular regions in each of said x and said y directions.

10. The method as claimed in claim 9, wherein said micro apertures in a common one of said one or more rectangular portions have a common area size.

11. The method as claimed in claim 10, wherein said micro apertures are rectangular and have a common side length in said x direction and a common side length in said y direction in a corresponding one of said one or more rectangular portions.

12. The method as claimed in claim 10, wherein said micro apertures are rectangles having first and second pairs of sides extending in said x direction and in said y direction, respectively, widths of masking beams between said micro apertures being the same for both said x direction and said y direction.

13. The method as claimed in claim 8, wherein said step b) creates said micro apertures such that widths of masking beams between adjacent said micro apertures are wider than a predetermined width.

14. The method as claimed in claim 8, wherein said step b) creates said micro apertures such that widths of masking beams between adjacent said micro apertures are wider than 2 μm.

15. The method as claimed in claim 8, wherein when one of said one or more rectangular portions has one side shorter than a predetermined length, said step a) defines said micro rectangular regions having the same side length as said one side for said one of said one or more rectangular portions; and
   said step b) creates said micro apertures having the same side length as said one side for said one of said one or more rectangular portions.

16. The method as claimed in claim 15, wherein said predetermined length is 20 µm.

17. A method of exposing an object to an electron beam using a mask having a plurality of pattern exposure blocks, each pattern exposure block, when selected, determining the shaping of an electron beam passing therethrough and being directed to said object to form a pattern on said object, said method comprising the steps of:

a) defining, in each pattern exposure block, plural micro rectangular regions forming said pattern on a plate capable of blocking said electron beam and, in each pattern exposure block, plural micro rectangular regions corresponding to the respective pattern exposure block;

b) forming micro apertures extending through said plates, each of said micro rectangular regions having a respective micro aperture and each micro aperture having an area size smaller than that of the respective said micro rectangular region; and c) exposing a selected pattern on said object by passing said electron beam through said respective micro apertures of a selected pattern exposure block, a total current amount of said electron beam after passing through said micro apertures being smaller than a total current amount of said electron beam if passing through an aperture in the plate having an area size defined by the respective micro rectangular regions of the selected pattern exposure block.

18. The method as claimed in claim 17, wherein said step c) exposes said object to said electron beam for a length of time which is A/B as long as a reference time length, wherein said A is an area size if said pattern, said B is a total read size of said micro apertures and said refernce time length is a time period appropriate for exposure of said pattern on said object by said electron beam passing through an aperture having a shape and a total area size of said micro rectangular regions defining said pattern on said plate.

19. A method of exposing an object to an electron beam using a mask having a plurality of pattern exposure blocks, each pattern exposure block, when selected, determining the shape of an electron beam passing therethrough so as to expose the respective pattern thereof on the object, each block having at least two apertures and each aperture passing a corresponding portion of the electron beam therethrough for forming a corresponding portion of the respective pattern on said object, first and second apertures of respective first and second, different area sizes Producing first and second different exposure levels of the corresponding first and second portions of the pattern on said object, said method comprising the steps of:

a) determining. for a uniform current level of said electron beams on a surface of a selected pattern exposure block, a reference current level at which a first portion of the pattern corresponding to a first aperture is properly exposed while all other portions of said pattern corresponding to all other apertures are either properly exposed or overexposed;

b) adjusting the respective area sizes of all other apertures producing overexposed, respective sections of the pattern in accordance with the uniform electron beam passing therethrough so as to reduce the current level of said electron beam passing through each of the other apertures and produce corresponding proper exposures of the respective portions of the pattern on the object; and c) exposing said pattern on said object while maintaining said uniform at said reference level, passing through the plural apertures of the selected pattern exposure block.

20. The method as claimed in claim 19, wherein the step of reducing the area sizes of the other apertures comprises defining beams effectively inserted into the other apertures, each beam extending between and having opposite ends integral with respective, opposite side edges of each aperture and having a width selected so as to have a negligible effect on the corresponding portion of the pattern widths of said first masking beams have a negligible effect on projected patterns of said other apertures on said object.

21. The method as claimed in claim 20, wherein said respective widths of said first masking beams are within a range between 0.02 µm and 0.06 µm.

22. The method as claimed in claim 19, further comprising the steps of:

d) inserting second masking beams into said first aperture and into said other apertures having first masking beams inserted therein so as to reduce a current level of said electron beam when said current level of said electron beam passing through said first aperture and passing through said other apertures with said first beams, is greater than a predetermined amount at which Coulomb interaction occurs; and e) determine an exposure time such that said reference current amount of said electron beam gives an appropriate exposure amount for all portions of said pattern.

23. The method as claimed in claim 22, wherein the Coulomb interaction effect is negligible when said current amount is less than said predetermined amount.

24. The method as claimed in claim 22, wherein said step e) determines said exposure times based on a total of the respective area sizes of said first aperture and said other apertures.

25. The method as claimed in claim 22, further comprising the steps of:

f) generating respective exposure-information data for said plural blocks, said exposure-information data indicating whether at least one of said first and said second beams and said second beams are present; and g) generating respective exposure-amount-correction data for said blocks, said exposure-amount-correction data being used for creating a corresponding pattern on said object with an appropriate exposure amount, wherein said step c) exposes said pattern onto said object by using said exposure-information data and said exposure-amount-correction data.

26. A method of exposing an object to an electron beam using a mask having a plurality of pattern exposure blocks, each having plural apertures, an electron beam passing through said at least one aperture of a selected said block and forming a respective pattern on said object, said method comprising the steps of:

a) inserting masking beams into one aperture for one of said blocks;

b) generating exposure-information data, for each of said blocks, indicating whether said beams are present;

c) generating respective exposure-amount-correction data for said blocks, used for creating a corresponding pattern on said object with an appropriate exposure amount; and d) exposing said object to form said pattern thereon with said appropriate exposure amount by using said exposure-information data and said exposure-amount-correction data.

27. The method as claimed in claim 26, further comprising a step f) of determining said appropriate exposure amount for each of said blocks, based on a total area size of said at least one aperture of a corresponding one of said blocks.

28. The method as claimed in claim 26, further comprising a step f) of obtaining in advance relations between appropriate exposure amounts and both sizes and numbers of said beams inserted into an aperture having a predetermined width.

29. A mask for exposure of an object by an electron beam, comprising:

a plate of a material which blocks the electron beam and which has plural pattern exposure blocks defined therein, each pattern exposure block having one or more corresponding aperture defining regions and each region having one or more apertures formed respectively therein and, when selected, determining the shape of the electron beam passing therethrough so as to expose a respective pattern on the object; and for each pattern exposure block, a total area of the respective aperture or apertures of the corresponding aperture defining region or regions thereof being selected to be smaller than the area size of the corresponding aperture defining region or regions in accordance with controlling the current level and/or the Coulomb interaction of the electron beam passing therethrough.

30. A method of forming a mask for exposure of an object by an electron beam, comprising:

defining plural pattern exposure blocks in a plate of a material which blocks the electron beam and, in each pattern exposure block, one or more corresponding aperture defining regions and, in each region, one or more respective apertures, each pattern exposure block, when selected, determining the shape of the electron beam passing therethrough so as to expose a respective pattern on the object; and for each pattern exposure block, selecting a total area of the respective aperture or apertures of the corresponding aperture defining region or regions thereof to be smaller than the area size of the corresponding aperture defining region or regions in accordance with controlling the current level and/or the Coulomb interaction of the electron beam passing therethrough.

* * * * *

UNITED STATES PATENT AND TRADEMARK OFFICE
CERTIFICATE OF CORRECTION

PATENT NO.: 5,824,437
DATED     : October 20, 1998
INVENTOR(S): Takayuki SAKAKIBARA et al.

It is certified that error appears in the above-identified patent and that said Letters Patent is hereby corrected as shown below:

Col. 10,   line 27, after "patterns" (second occurrence) insert --,--.

Col. 11,   line 3, after "no" insert --masking--.

Col. 13,   lines 34-35, delete "a beam insertion".

Col. 15,   line 67, after "block" (second occurrence) insert --,--.

Col. 19,   line 45, change "Producing" to --producing--.

Col. 20,   line 29, after "times" insert --,--.

UNITED STATES PATENT AND TRADEMARK OFFICE
CERTIFICATE OF CORRECTION

PATENT NO.: 5,824,437  
DATED : October 20, 1998  
INVENTOR(S): Takayuki SAKAKIBARA et al.

It is certified that error appears in the above-identified patent and that said Letters Patent is hereby corrected as shown below:

Col. 17, lines 41-42 (claim 1, lines 2-3), delete "said at least one aperture of".

Col. 19, line 65 (claim 19, line 30), after "said uniform" insert --electron beam current level--.

Col. 20, line 3, after "defining," and in line 4 (claim 20, line 4), after "each" insert --first masking--;
    lines 7-9 (claim 20, lines 7-9), delete "widths of said first masking beams have a negligible effect on projected patterns of said other apertures on said object."
    line 22 (claim 22, line 11), change "determine" to --determining--;
    line 37 (claim 25, line 6), change "and said second beams are" to --is--.

Signed and Sealed this

Eighth Day of June, 1999

Attest:

Q. TODD DICKINSON

*Attesting Officer*      *Acting Commissioner of Patents and Trademarks*